US011398418B2

(12) United States Patent
Sugiura

(10) Patent No.: US 11,398,418 B2
(45) Date of Patent: Jul. 26, 2022

(54) SEMICONDUCTOR MODULE

(71) Applicant: DENSO CORPORATION, Aichi-pref (JP)

(72) Inventor: Hidekazu Sugiura, Seto (JP)

(73) Assignee: DENSO CORPORATION, Kariya (JP)

(*) Notice: Subject to any disclaimer, the term of this patent is extended or adjusted under 35 U.S.C. 154(b) by 0 days.

(21) Appl. No.: 16/683,330

(22) Filed: Nov. 14, 2019

(65) Prior Publication Data
US 2020/0194358 A1    Jun. 18, 2020

(30) Foreign Application Priority Data

Dec. 17, 2018    (JP) .............................. JP2018-235362

(51) Int. Cl.
*H01L 23/495*    (2006.01)
*H01L 29/739*    (2006.01)
*H01L 29/78*    (2006.01)
*H01L 29/861*    (2006.01)
*H01L 29/16*    (2006.01)

(52) U.S. Cl.
CPC .. *H01L 23/49575* (2013.01); *H01L 23/49562* (2013.01); *H01L 29/1608* (2013.01); *H01L 29/7395* (2013.01); *H01L 29/78* (2013.01); *H01L 29/861* (2013.01)

(58) Field of Classification Search
None
See application file for complete search history.

(56) References Cited

U.S. PATENT DOCUMENTS

| 10,103,091 | B2 * | 10/2018 | Takahagi | .......... H01L 23/49524 |
| 2012/0235162 | A1 * | 9/2012 | Isobe | .................... H01L 23/473 257/77 |
| 2013/0181228 | A1 * | 7/2013 | Usui | ....................... H01L 24/97 257/77 |
| 2014/0159216 | A1 * | 6/2014 | Ishino | ................. H01L 23/3114 257/675 |
| 2016/0336251 | A1 * | 11/2016 | Fukuoka | ............. H01L 29/7395 |
| 2017/0047923 | A1 |  2/2017 | Inaba et al. | |

(Continued)

FOREIGN PATENT DOCUMENTS

| CN | 106449608 A | 2/2017 |
| JP | 2007-305836 A | 11/2007 |

(Continued)

*Primary Examiner* — Abul Kalam
(74) *Attorney, Agent, or Firm* — Sughrue Mion, PLLC

(57) ABSTRACT

A semiconductor module may include: a first semiconductor chip including a first semiconductor substrate including a field effect transistor and constituted of SiC, a drain electrode and a source electrode provided on the first semiconductor substrate; a second semiconductor chip including a second semiconductor substrate including a diode, a cathode electrode and an anode electrode provided on the second semiconductor substrate; a first lead frame including a first main terminal and connected to the drain electrode and the cathode electrode; and a second lead frame including a second main terminal and connected to the source electrode and the anode electrode. A first current path extending from the second to first main terminal via the first semiconductor chip may be longer than a second current path extending from the second to first main terminal via the second semiconductor chip.

3 Claims, 14 Drawing Sheets

(56) References Cited

U.S. PATENT DOCUMENTS

| | | | |
|---|---|---|---|
| 2018/0041107 A1 | 2/2018 | Yamahira et al. | |
| 2018/0261532 A1* | 9/2018 | Takahagi | H01L 23/495 |
| 2018/0269799 A1* | 9/2018 | Kimura | H02M 7/5387 |

FOREIGN PATENT DOCUMENTS

| | | |
|---|---|---|
| JP | 2013-149730 A | 8/2013 |
| JP | 2017-077121 A | 4/2017 |
| JP | 2018-22846 A | 2/2018 |
| JP | 2018-186302 A | 11/2018 |

\* cited by examiner

SEMICONDUCTOR MODULE

TECHNICAL FIELD

A technique disclosed herein relates to a semiconductor module.

BACKGROUND

Japanese Patent Application Publication No. 2007-305836 describes a semiconductor module. This semiconductor module includes a field effect transistor (hereinafter, referred to as an FET) and a diode (hereinafter, referred to as a main diode). The FET is provided in a semiconductor substrate constituted of SiC (silicon carbide). A drain of the FET and a cathode of the main diode are connected to a common terminal (hereinafter, referred to as a first terminal), and a source of the FET and an anode of the main diode are connected to another common terminal (hereinafter, referred to as a second terminal). A body diode is provided inside the FET in a parasitic manner. An anode of the body diode is connected to the source of the FET (i.e., the second terminal), and a cathode of the body diode is connected to the drain of the FET (i.e., the first terminal). Therefore, the main diode and the body diode are connected in parallel between the first terminal and the second terminal. When a potential of the second terminal becomes higher than a potential of the first terminal, a voltage is applied to the main diode in a forward direction and the main diode is thereby turned on. Since the forward voltage is also applied to the body diode at this time, the body diode could be turned on as well. When a current flows through the body diode, SiC crystals are deteriorated in the semiconductor substrate in which the FET is provided. For this problem, the technique of Japanese Patent Application Publication No. 2007-305836 prevents the body diode from being turned on by setting a turn-on voltage of the main diode to be lower than an energization start voltage of the body diode. Thus, deterioration of SiC crystals is prevented.

SUMMARY

In a circuit in which a main diode and a body diode are connected in parallel to each other as in Japanese Patent Application Publication No. 2007-305836, an inrush current may flow through the main diode and the body diode in the forward direction because of an influence of inductance on the circuit. Even the technique of Japanese Patent Application Publication No. 2007-305836 cannot prevent such inrush current from flowing through live body diode. Therefore, SiC crystals in a semiconductor substrate provided with an FET are deteriorated by the inrush current. The disclosure herein provides a technique that prevents deterioration of SiC crystals caused by an inrush current.

A semiconductor module disclosed herein may comprise a first semiconductor chip, a second semiconductor chip, a first lead frame, and a second lead frame. The first semiconductor chip may comprise: a first semiconductor substrate comprising a field effect transistor and constituted of SiC; a drain electrode provided on one surface of the first semiconductor substrate; and a source electrode provided on a surface of the first semiconductor substrate other than the one surface of the first semiconductor substrate. The second semiconductor chip may comprise: a second semiconductor substrate comprising a diode; a cathode electrode provided on one surface of the second semiconductor substrate; and an anode electrode provided on a surface of the second semiconductor substrate other than the one surface of the second semiconductor substrate. The first lead frame may comprise a first main terminal and be connected to the drain electrode and the cathode electrode. The second lead frame may comprise a second main terminal and be connected to the source electrode and the anode electrode. A first current path extending from the second main terminal to the first main terminal via the first semiconductor chip may be longer than a second current path extending from the second main terminal to the first main terminal via the second semiconductor chip.

In this semiconductor module, when a potential of the second main terminal rapidly increases with respect to a potential of the first main terminal, an inrush current flows in the first current path (that is, a body diode of the field effect transistor of the first semiconductor chip) and the second current path (that is, the diode of the second semiconductor chip). Since the first current path is longer than the second current path, a parasitic inductance of the first current path is larger than a parasitic inductance of the second current path. In the first current path having the larger parasitic inductance, an increase in the current is suppressed as compared to that in the second current path having the smaller parasitic inductance. Thus, the inrush current flows in the second current path more than in the first current path. Therefore, the inrush current that flows through the body diode of the field effect transistor of the first semiconductor chip is suppressed. Consequently, deterioration of SiC crystals in the first semiconductor substrate is suppressed.

BRIEF DESCRIPTION OP DRAWINGS

DETAILED DESCRIPTION

Figure 1:
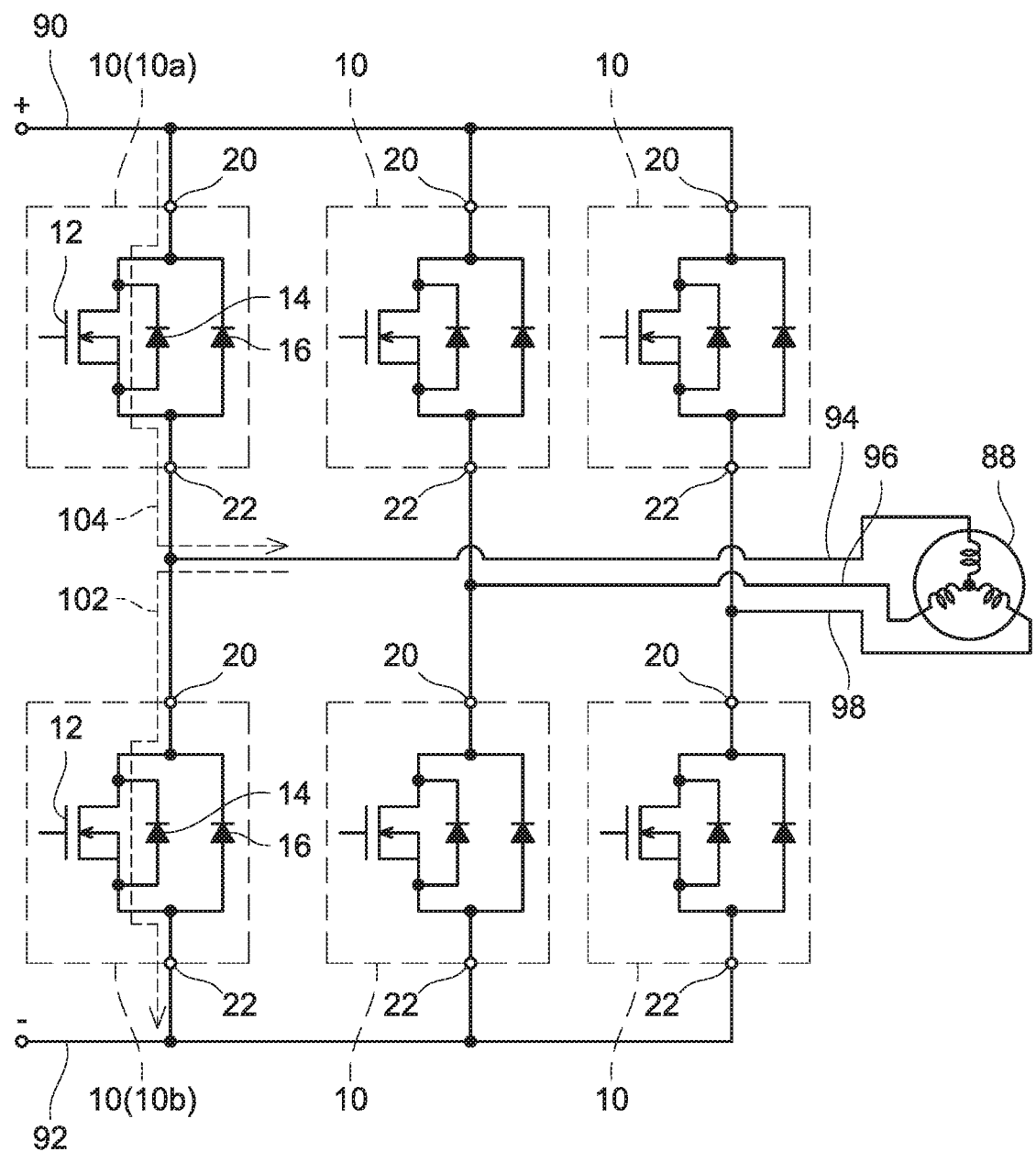
FIG. 1 is a circuit diagram of an inverter circuit that includes semiconductor modules according to an embodiment.

FIG. 1 illustrates an inverter circuit that includes semiconductor modules 10 according to an embodiment. The inverter circuit includes a high-potential wire 90, a low-potential wire 92, and three output wires 94, 96, and 98. A direct-current voltage is applied between the high-potential wire 90 and the low-potential wire 92 by a power source (not illustrated). An L load 88 (e.g., a three-phase motor) is connected to the output wires 94, 96, and 98. One semiconductor module 10 is connected between the high-potential wire 90 and the output wire 94. One semiconductor module 10 is connected between the high-potential wire 90 and the output wire 96. One semiconductor module 10 is connected between the high-potential wire 90 and the output wire 98. One semiconductor module 10 is connected between the low-potential wire 92 and the output wire 94. One semiconductor module 10 is connected between the low-potential wire 92 and the output wire 96. One semiconductor module 10 is connected between the low-potential wire 92 and the output wire 98. By MOSFETs 12 of the semiconductor modules 10 switching, three-phase alternating-current power is supplied to the L load 88 via the output wires 94, 96, and 98.

Figure 2:
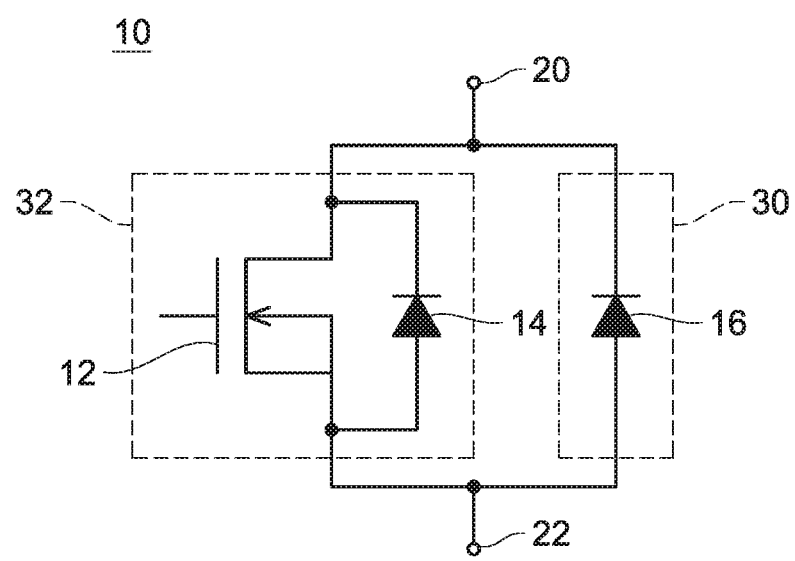
FIG. 2 is a circuit diagram of the semiconductor module according to the embodiment.

FIG. 2 is a circuit diagram of the semiconductor module 10. As illustrated in FIG. 2, the semiconductor module 10 includes a field effect transistor 12 and a diode 16. A metal oxide semiconductor field effect transistor (MOSFET) is used as the field effect transistor 12 in the present embodiment. A drain of the MOSFET 12 is connected to a main terminal 20, and a source of the MOSFET 12 is connected to a main terminal 22. The MOSFET 12 includes a body diode 14. The body diode 14 is a pn diode that is provided inside the MOSFET 12 in a parasitic manner. A cathode of the body diode 14 is connected to the main terminal 20, and an anode of the body diode 14 is connected to the main terminal 22. The diode 16 may be a pn diode or a Schottky barrier diode. A cathode of the diode 16 is connected to the main terminal 20, and an anode of the diode 16 is connected to the main terminal 22. As illustrated in FIG. 1, in the semiconductor modules 10 of an upper arm, the main terminals 20 are connected to the high-potential wire 90, and each of the main terminals 22 is connected to corresponding one of live output wires 94, 96, and 98. In the semiconductor modules 10 of a lower arm, each of the main terminals 20 is connected to corresponding one of the output wires 94, 96, and 98, and the main terminals 22 are connected to the low-potential wire 92.

Figure 3:
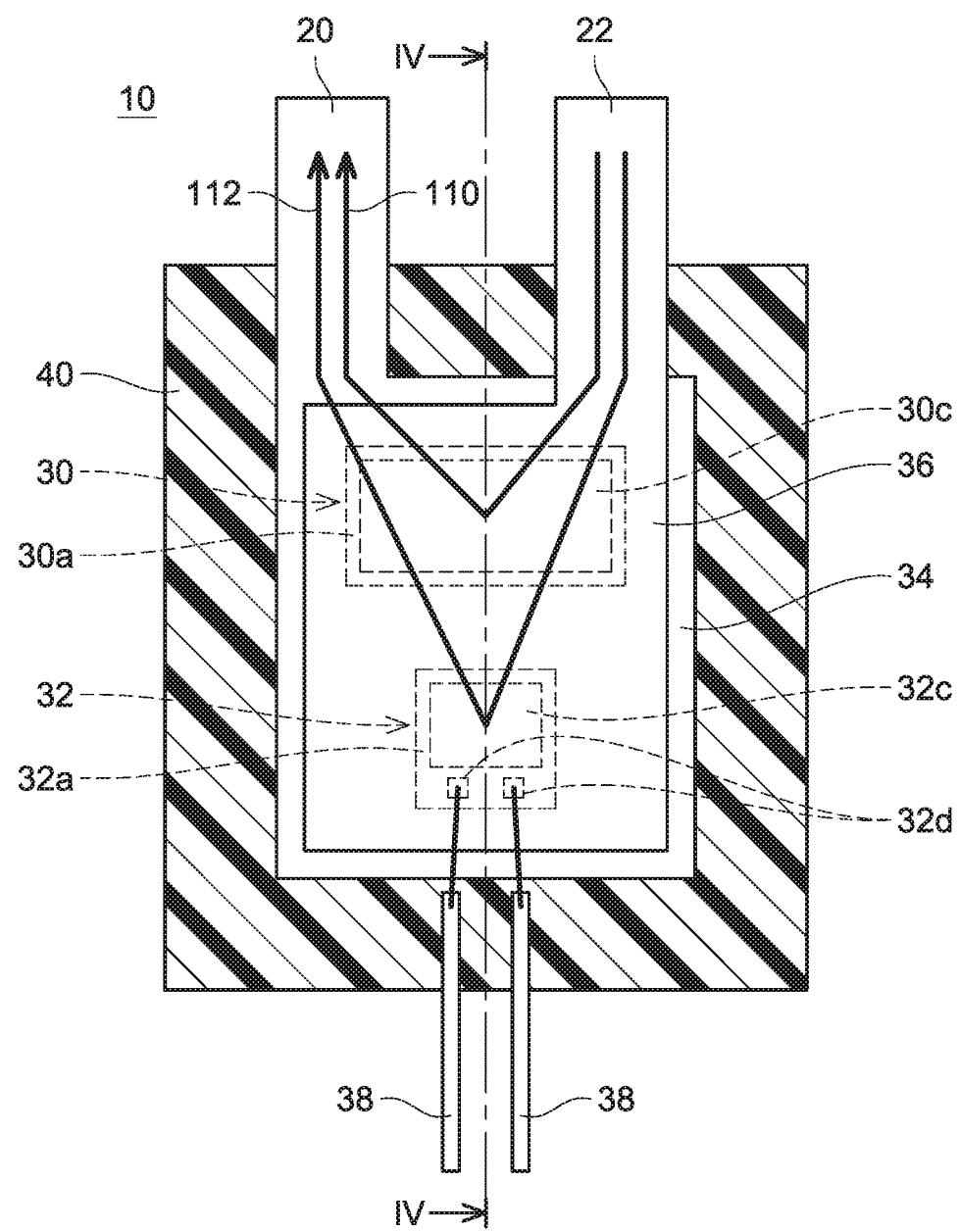
FIG. 3 is a plan view of the semiconductor module according to the embodiment.
Figure 4:
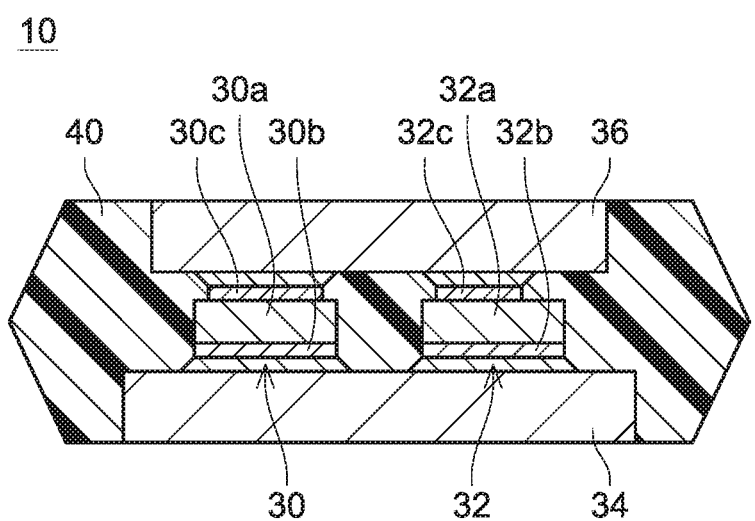
FIG. 4 is a cross-sectional view along a line IV-IV in FIG. 3.

FIGS. 3 and 4 illustrate a configuration of the semiconductor module 10. As illustrated in FIGS. 3 and 4, the semiconductor module 10 includes a semiconductor chip 30, a semiconductor chip 32, a lead frame 34, a lead frame 36, and an insulating resin 40. The MOSFET 12 and the body diode 14 in FIG. 2 are provided in the semiconductor chip 32. The diode 16 in FIG. 2 is provided in the semiconductor chip 30. As illustrated in FIG. 4, the semiconductor chips 30 and 32 are arranged on the lead frame 34. The lead frame 36 is arranged on the semiconductor chips 30 and 32.

As illustrated in FIG. 4, the semiconductor chip 32 includes a semiconductor substrate 32a, a drain electrode 32b, and a source electrode 32c. The semiconductor substrate 32a is constituted of SiC. The MOSFET 12 and the body diode 14 are provided inside the semiconductor substrate 32a. The drain electrode 32b is provided on a lower surface of the semiconductor substrate 32a. The drain electrode 32b is a drain electrode of the MOSFET 12 and is also a cathode electrode of the body diode 14. The drain electrode 32b is connected to the lead frame 34 with solder. The source electrode 32c is provided on an upper surface of the semiconductor substrate 32a. The source electrode 32c is a source electrode of the MOSFET 12 and is also an anode electrode of the body diode 14. The source electrode 32c is connected to the lead frame 36 with solder. As illustrated in FIG. 3, a plurality of signal electrodes 32d is provided on the upper surface of the semiconductor substrate 32a. The signal electrodes 32d include a gate electrode of the MOSFET 12 and a Kelvin source electrode. Each of the signal electrodes 32d is connected to corresponding one of signal terminals 38 with a bonding wire.

As illustrated in FIG. 4, the semiconductor chip 30 includes a semiconductor substrate 30a, a cathode electrode 30b, and an anode electrode 30c. The semiconductor substrate 30a may be constituted of silicon or SiC. The diode 16 is provided inside the semiconductor substrate 30a. The cathode electrode 30b is provided on a lower surface of the semiconductor substrate 30a. The cathode electrode 30b is connected to the lead frame 34 with solder. The anode electrode 30c is provided on an upper surface of the semiconductor substrate 30a. The anode electrode 30c is connected to the lead frame 36 with solder.

The insulating resin 40 covers the semiconductor chips 30 and 32 and surfaces of the lead frames 34 and 36 around them.

As illustrated in FIG. 3, the main terminal 20 is provided at a part of the lead frame 34. The main terminal 20 protrudes outward from the insulating resin 40. The main terminal 22 is provided at a part of the lead frame 36. The main terminal 22 protrudes outward from the insulating resin 40. The main terminals 20 and 22 extend approximately parallel to each other and protrude outward from a common side surface of the insulating resin 40. When the lead frame 34, the semiconductor chips 30 and 32, and the lead frame 36 are seen along a direction in which they are stacked, as illustrated in FIG. 3, the semiconductor chip 30 is arranged at a closer position to the main terminals 20 and 22 than the semiconductor chip 32.

A forward voltage (a forward voltage drop when a reference current flows) of the diode 16 is lower than a forward voltage of the body diode 14. Therefore, in a state where a direct-current voltage is steadily applied in the forward direction to a parallel circuit of the diode 16 and the body diode 14, a current flows through the diode 16, whereas almost no current flows through the body diode 14. That is, in a state where a direct-current voltage that makes a potential of the main terminal 22 higher than a potential of the main terminal 20 is steadily applied, a current flows through the diode 16, whereas almost no current flows through the body diode 14. As such, almost no current flows through the body diode 14 in the steady state. Meanwhile, the potential of the main terminal 22 may rapidly increase with respect to the potential of the main terminal 20. In this case, an inrush current flows through both the diode 16 and the body diode 14 because of an influence of inductance in like circuit. The inrush current will be described below.

In FIG. 1, when the MOSFET 12 of a lower-arm semiconductor module 10b is on and the MOSFET 12 of an upper-arm semiconductor module 10a is off, a current flows from the output wire 94 to the low-potential wire 92 via the lower arm MOSFET 12, as illustrated with an arrow 102. Thereafter, when the lower arm MOSFET 12 is turned off, a potential of the output wire 94 is increased by induced electromotive force of the L load 88. As a result, the potential of the main terminal 22 of the upper-arm semiconductor module 10a rapidly increases to a potential higher than a potential of the high-potential wire 90. Thus, an inrush current flows through the body diode 14 and the diode 16 of the upper-arm semiconductor module 10a.

In FIG. 1, when the MOSFET 12 of the upper-arm semiconductor module 10a is on and the MOSFET 12 of the lower-arm semiconductor module 10b is off, a current flows from the high-potential wire 90 to the output wire 94 via the upper-arm MOSFET 12, as illustrated with ail arrow 104. Thereafter, when the upper-arm MOSFET 12 is fumed off, the potential of the output wire 94 is lowered by the induced electromotive force of the L load 88. As a result, the potential of the main terminal 20 of the lower-arm semiconductor module 10b rapidly lowers to a potential lower than the potential of the low-potential wire 92. That is, the potential of the main terminal 22 rapidly increases with respect to the potential of the main terminal 20 in the lower-arm semiconductor module 10b. Thus, an inrush current flows through the body diode 14 and the diode 16 of the lower-arm semiconductor module 10b.

As described above, an inrush current flows through the body diode 14 and the diode 16 in both the upper-arm semiconductor module 10 and the lower-arm semiconductor module 10. However, in the semiconductor module 10 of the embodiment, an inrush current that flows through the body diode 14 can be reduced, as described below.

Arrows 110 and 112 in FIG. 3 represent current paths of inrush currents. The current path 110 is a current path of an inrush current that flows through the semiconductor chip 30 (that is, the diode 16), and the current path 112 is a current path of an inrush current that flows through the semiconductor chip 32 (that is, the body diode 14). In the current path 110, the inrush current flows through the lead frame 36 from the main terminal 22 to a portion located over the semiconductor chip 30. Thereafter, the inrush current flows through the semiconductor chip 30 in a thickness direction, and then flows through the lead frame 34 to the main terminal 20. In the current path 112, the inrush current flows through the lead frame 36 from the main terminal 22 to a portion located over the semiconductor chip 32. Thereafter, the inrush current flows through the semiconductor chip 32 in the thickness direction, and then flows through the lead frame 34 to the main terminal 20.

Figure 5:
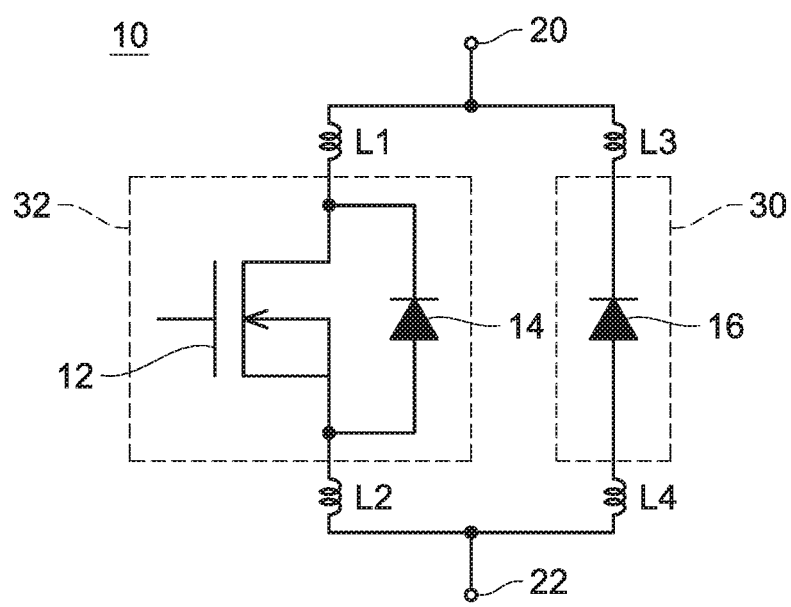
FIG. 5 is a circuit diagram of the semiconductor module according to the embodiment, which illustrates parasitic inductances.

As is apparent from FIG. 3, the current path 112 is longer than the current path 110. Therefore, a parasitic inductance of the current path 112 is larger than a parasitic inductance of live current path 110. FIG. 5 illustrates the circuit diagram of FIG. 2 with parasitic inductances added thereto. An inductance L1 in FIG. 5 is a parasitic inductance of a path between the semiconductor chip 32 and the main terminal 20, an inductance L2 in FIG. 5 is a parasitic inductance of a path between the semiconductor chip 32 and the main terminal 22, an inductance L3 in FIG. 5 is a parasitic inductance of a path between the semiconductor chip 30 and the main terminal 20, and an inductance L4 in FIG. 5 is a parasitic inductance of a path between the semiconductor chip 30 and the main terminal 22. Since the current path 112 is longer than the current path 110 as described above, the parasitic inductance L1 is larger than the parasitic inductance L3, and the parasitic inductance L2 is larger than the parasitic inductance L4. Therefore, an inrush current is less likely to flow-through the body diode 14 than through the diode 16 when the potential of the main terminal 22 rapidly increases with respect to the potential of the main terminal 20.

Figure 6:
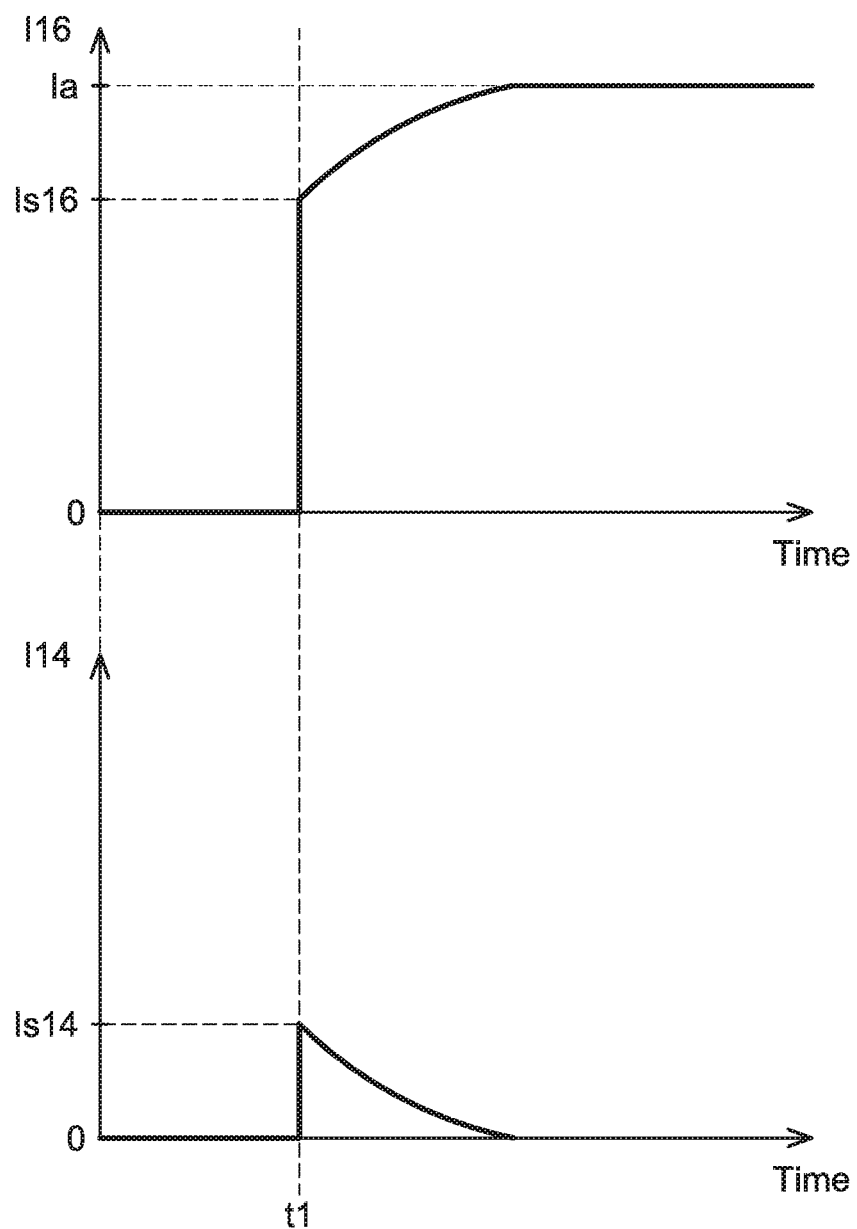
FIG. 6 is a graph that shows inrush currents flowing through the semiconductor module according to the embodiment.
Figure 7:
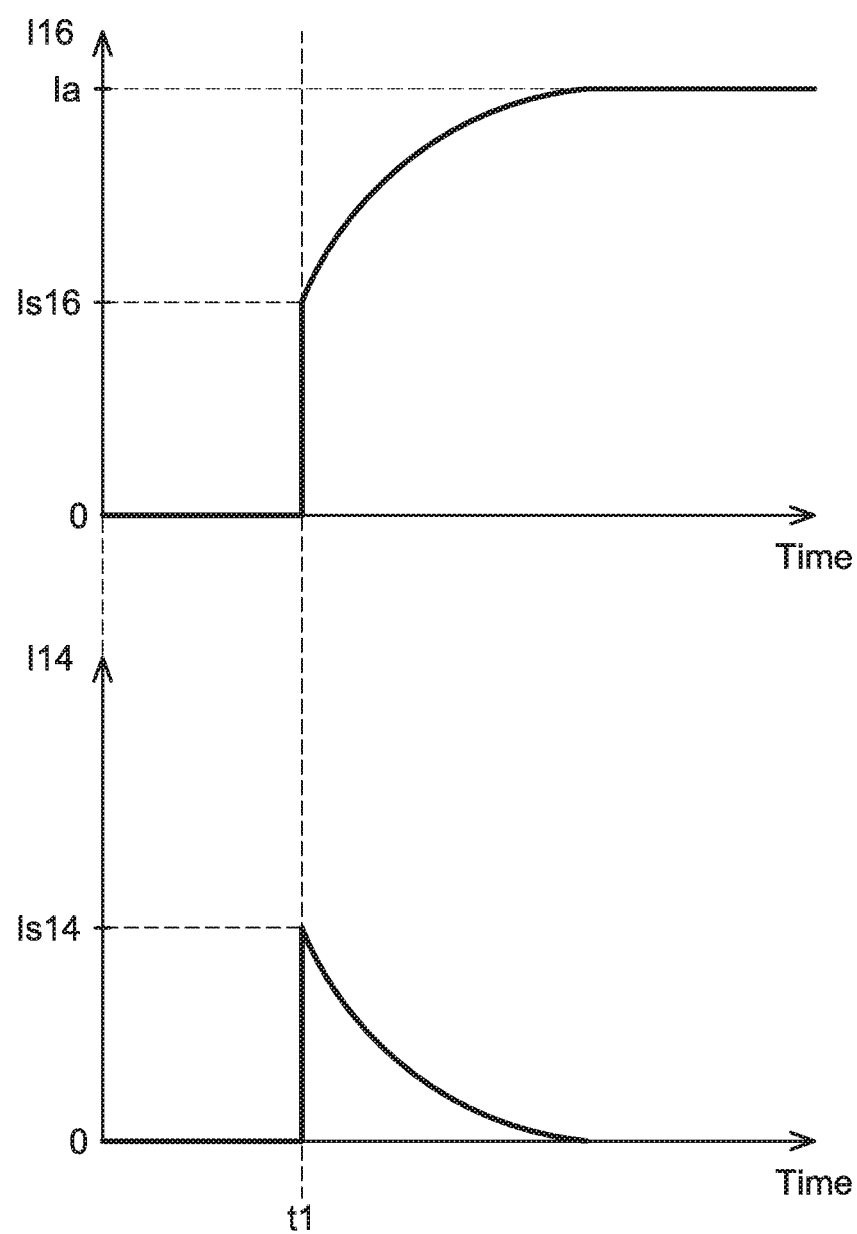
FIG. 7 is a graph that shows inrush currents flowing through a semiconductor module according to a comparative example.

FIG. 6 illustrates inrush currents that flow through the semiconductor module 10 according to the present embodiment. FIG. 7 illustrates, as a comparative example, inrush currents that flow through a semiconductor module in which a current path for the diode 16 and a current path for the body diode 14 have approximately equal lengths to each other. In both FIGS. 6 and 7, at a timing t1 at which the potential of the main terminal 22 rapidly increases, a current 116 that flows through the diode 16 rapidly increases and a current 114 that flows through the body diode 14 also increases rapidly. That is, an inrush current Is16 flows through the diode 16 and an inrush current Is14 also flows through the body diode 14. After the timing t1, the current gradually lowers to approximately zero in the body diode 14 having a higher forward voltage, and the current gradually increases to a constant value Ia in the diode 16 having a lower forward voltage. Since the current paths for the diode 16 and the body diode 14 are approximately equal to each other (i.e., parasitic inductances thereof are equal to each other) in the semiconductor module of the comparative example, the inrush current Is16 that flows through the diode 16 and the inrush current Is14 that flows through the body diode 14 are approximately equal to each other as illustrated in FIG. 7. Contrary to this, in the semiconductor module 10 of the present embodiment, the parasitic inductance of the current path for the body diode 14 is larger than that of the current path for the diode 16, thus the inrush current Is14 that flows through the body diode 14 is smaller than the inrush current Is16 that flows through the diode 16 as illustrated in FIG. 6. Accordingly, the inrush current Is14 illustrated in FIG. 6 is smaller than the inrush current Is14 illustrated in FIG. 7. As described above, according to the semiconductor module 10 of the present embodiment, the inrush current that flows through the body diode 14 can be suppressed.

There are basal plane dislocations inside SiC crystals. When a current flows through SiC crystals, stacking fault grows from the basal plane dislocations, which results in deterioration of the SiC crystals. The deterioration of the SiC crystals causes the resistance of the SiC crystals become higher. As described above, an inrush current that flows through the body diode 14 can be suppressed according to the semiconductor module 10 of the present embodiment. Therefore, deterioration of the semiconductor substrate 32a (that is, SiC crystals) constituting the body diode 14 can be suppressed. Accordingly, an increase in on-resistance of the MOSFET 12 can be suppressed.

Figure 8:
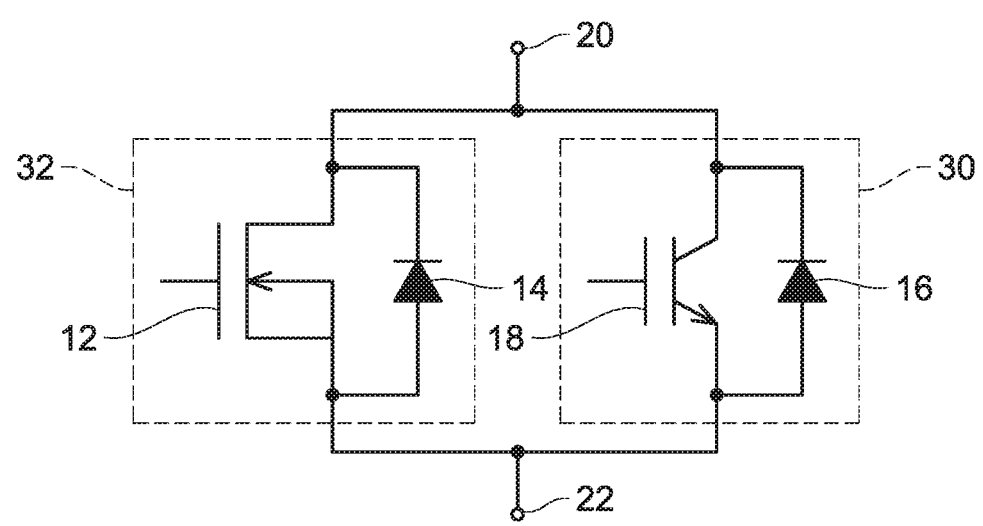
FIG. 8 is a circuit diagram of a semiconductor module according to a first variant.

In the above-described embodiment, the semiconductor chip 30 includes the diode 16 only. However, as illustrated in FIG. 8, the semiconductor chip 30 may further include an insulated gate bipolar transistor (hereinafter, an IGBT) 18 connected in parallel to the diode 16. In this configuration, the IGBT 18 is provided in the semiconductor substrate 30a (see FIG. 4). A collector of the IGBT 18 is connected to the cathode electrode 30b (see FIG. 4) and an emitter of the IGBT 18 is connected to the anode electrode 30c (see FIG. 4). In this configuration, a current flows front the main terminal 20 to the main terminal 22 by turning on the IGBT 18.

Figure 9:
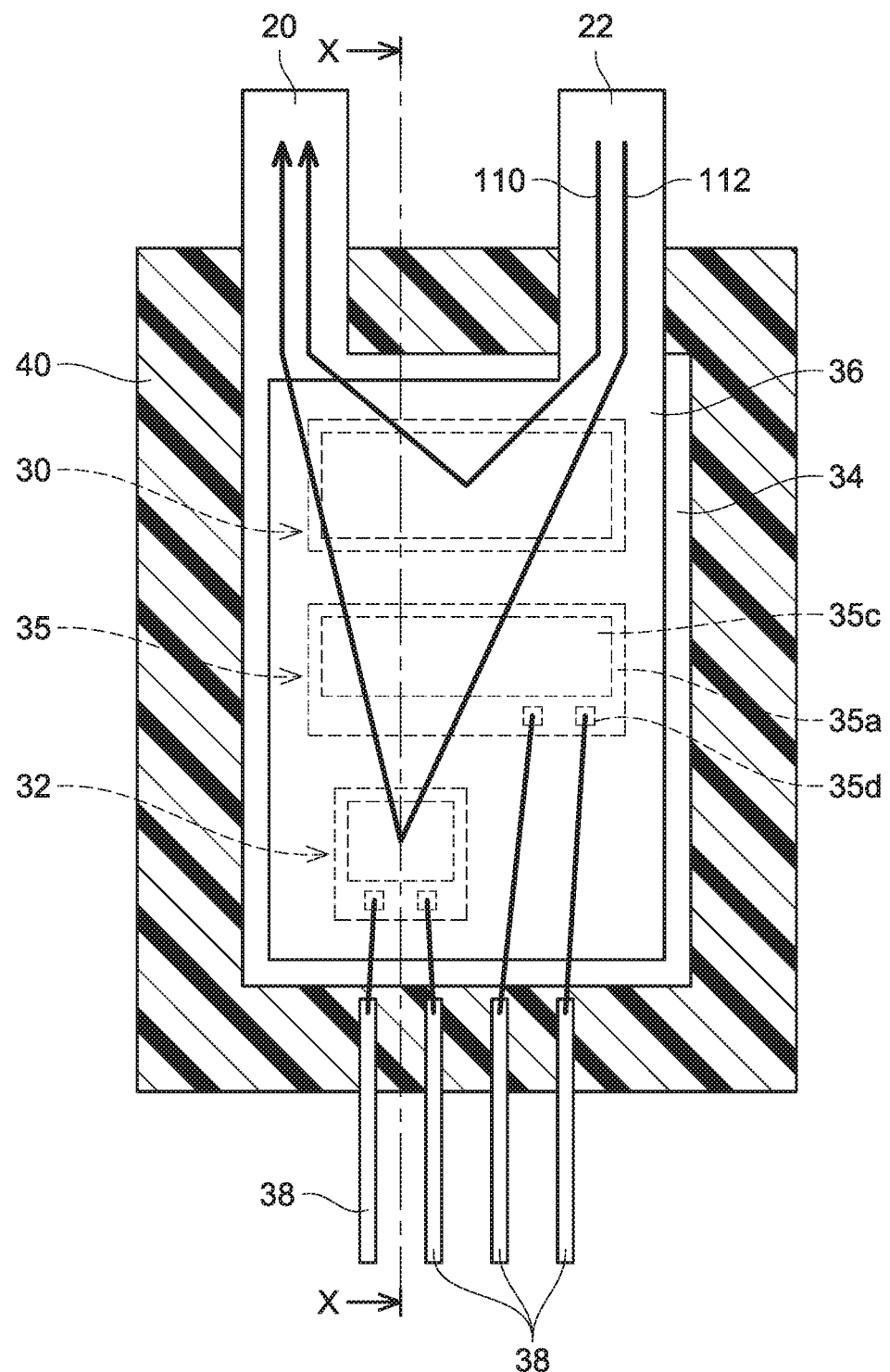
FIG. 9 is a plan view of a semiconductor module according to a second variant.
Figure 10:
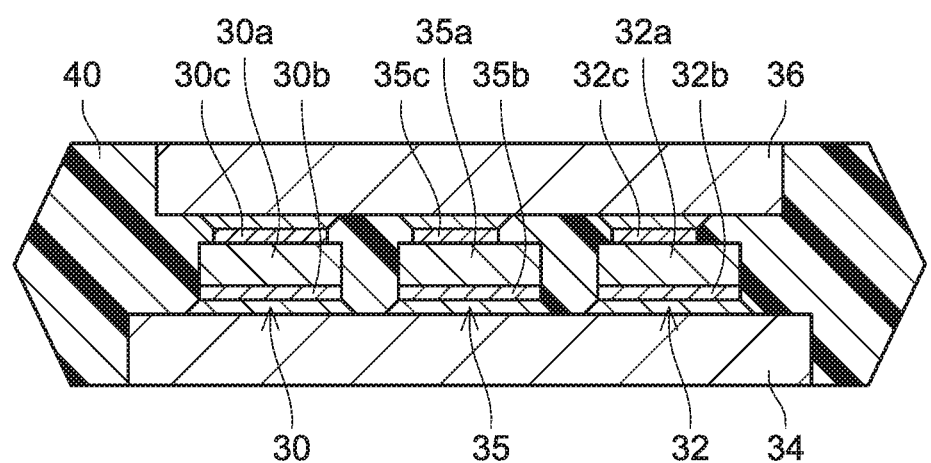
FIG. 10 is a cross-sectional view along a line X-X in FIG. 9.

Alternatively, the semiconductor module may further include a semiconductor chip 35 as illustrated in FIGS. 9 and 10. The semiconductor chip 35 includes a semiconductor substrate 35a, a collector electrode 35b, an emitter electrode 35c, and signal electrodes 35d. The semiconductor substrate 35a is constituted of silicon. An IGBT is provided in the semiconductor substrate 35a. The collector electrode 35b is provided on a lower surface of the semiconductor substrate 35a. The emitter electrode 35c and the signal electrodes 35d are provided on an upper surface of the semiconductor substrate 35a. The collector electrode 35b is connected to the lead frame 34 with solder. The emitter electrode 35e is connected to the lead frame 36 with solder. The signal electrodes 35d include a gate electrode of the IGBT and a Kelvin emitter electrode. Each of the signal electrodes 35d is connected to corresponding one of the signal terminals 38 with a bonding wire. As illustrated in FIG. 9, when the lead frame 34, the semiconductor chips 30, 32, and 35, and the lead frame 36 are seen along a direction in which they are stacked, the semiconductor chip 35 is arranged between the semiconductor chips 30 and 32. This arrangement of the semiconductor chip 35 makes a difference between the length of the current path 112 that passes through the semiconductor chip 32 and the length of the current path 110 that passes through the semiconductor chip 30 even larger. Therefore, the parasitic inductance of the current path 112 becomes much larger than the parasitic inductance of the current path 110. Accordingly, an inrush current dial flows through the body diode 14 can further be suppressed, thus deterioration of SiC crystals can further be suppressed.

Figure 11:
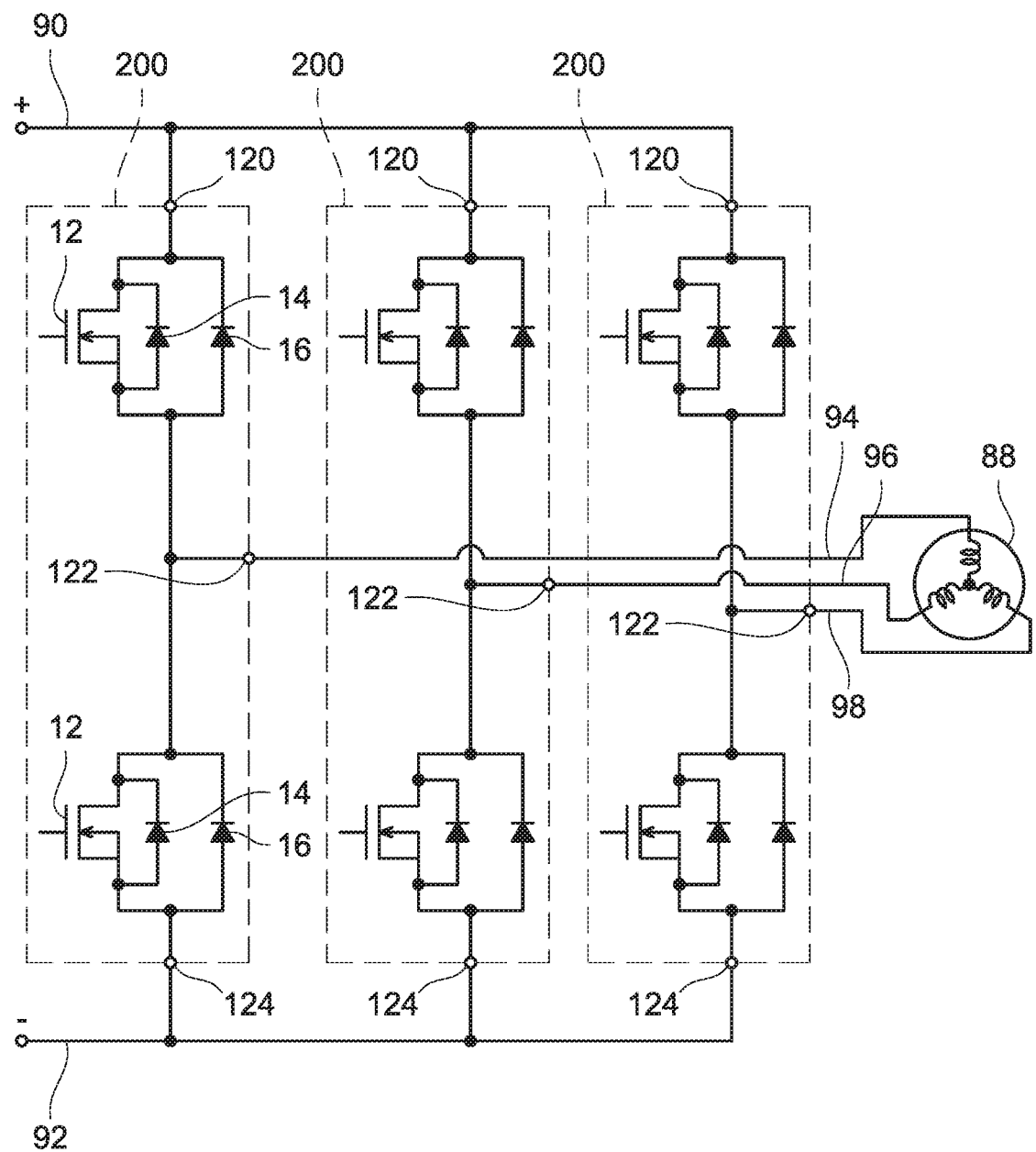
FIG. 11 is a circuit diagram of an inverter circuit that includes semiconductor modules according to a third variant.
Figure 12:
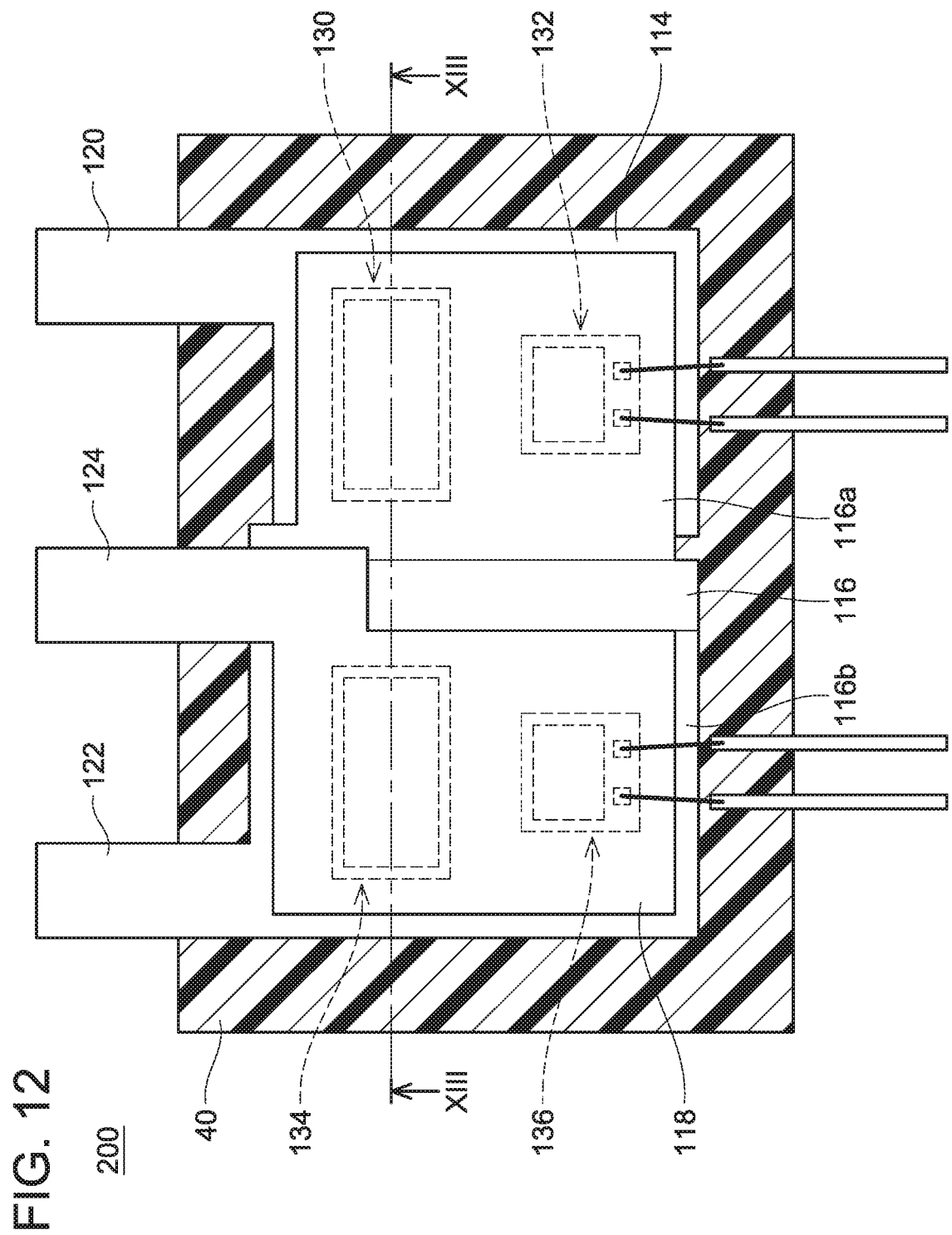
FIG. 12 is a plan view of the semiconductor module according to the third variant.
Figure 13:
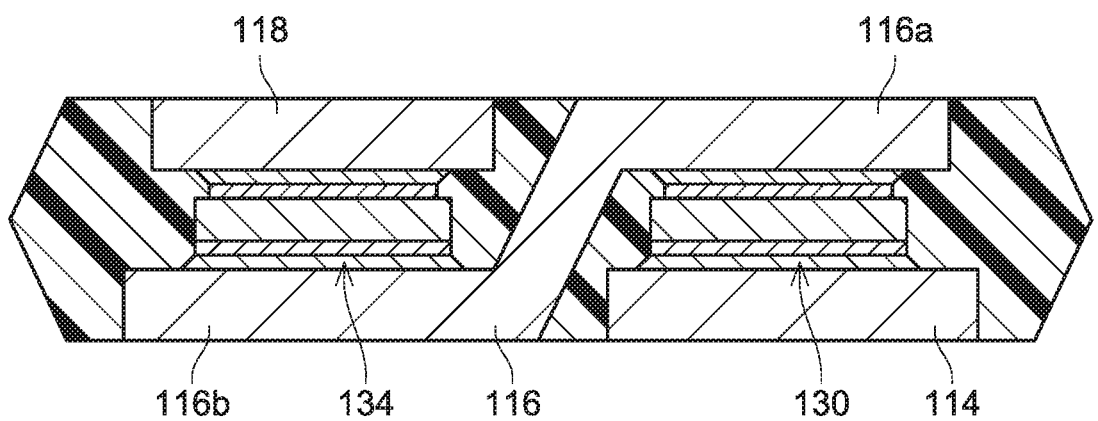
FIG. 13 is a cross-sectional view along a line XIII-XIII in FIG. 12.

Alternatively, each pair of an upper arm and a lower arm may be integrated in one semiconductor module 200 as illustrated in FIG. 11. In this case, a configuration illustrated in FIGS. 12 and 13 can be used as the semiconductor module 200, for example. As illustrated in FIGS. 12 and 13, the semiconductor module 200 includes lead frames 114, 116, and 118 and semiconductor chips 130, 132, 134, and 136. The semiconductor chip 130 (the diode 16 of the upper arm) and the semiconductor chip 132 (the MOSFET 12 of the upper arm) are connected onto the lead frame 114, and a first portion 116a of the lead frame 116 is connected onto the semiconductor chips 130 and 132. The lead frame 116 is partly bent, and a second portion 116b of the lead frame 116 is located at approximately the same height as the lead frame 114. The semiconductor chip 134 (the diode 16 of the lower arm) and the semiconductor chip 136 (the MOSFET 12 of the lower arm) are connected onto the second portion 116b of the lead frame 116, and the lead frame 118 is connected onto the semiconductor chips 134 and 136. A main terminal 120 extends from the lead frame 114. A main terminal 122 extends from the second portion 116b of the lead frame 116. A main terminal 124 extends from the lead frame 118. The main terminals 120, 122, and 124 extend approximately parallel to one another, and protrude outward from a common side surface of the insulating resin 40. A length of a current path from the main terminal 122 to the main terminal 120 via the semiconductor chip 132 is longer than a length of a current path from the main terminal 122 to the main terminal 120 via the semiconductor chip 130. Therefore, an inrush current is less likely to flow through the semiconductor chip 132 (that is, the body diode 14 of the upper arm). Further, a length of a current path from the main terminal 124 to the main terminal 122 via the semiconductor chip 136 is longer than a length of a current path from the main terminal 124 to the main terminal 122 via the semiconductor chip 134. Therefore, an inrush current is less likely to flow through the semiconductor chip 136 (that is, the body diode 14 of the lower arm).

Figure 14:
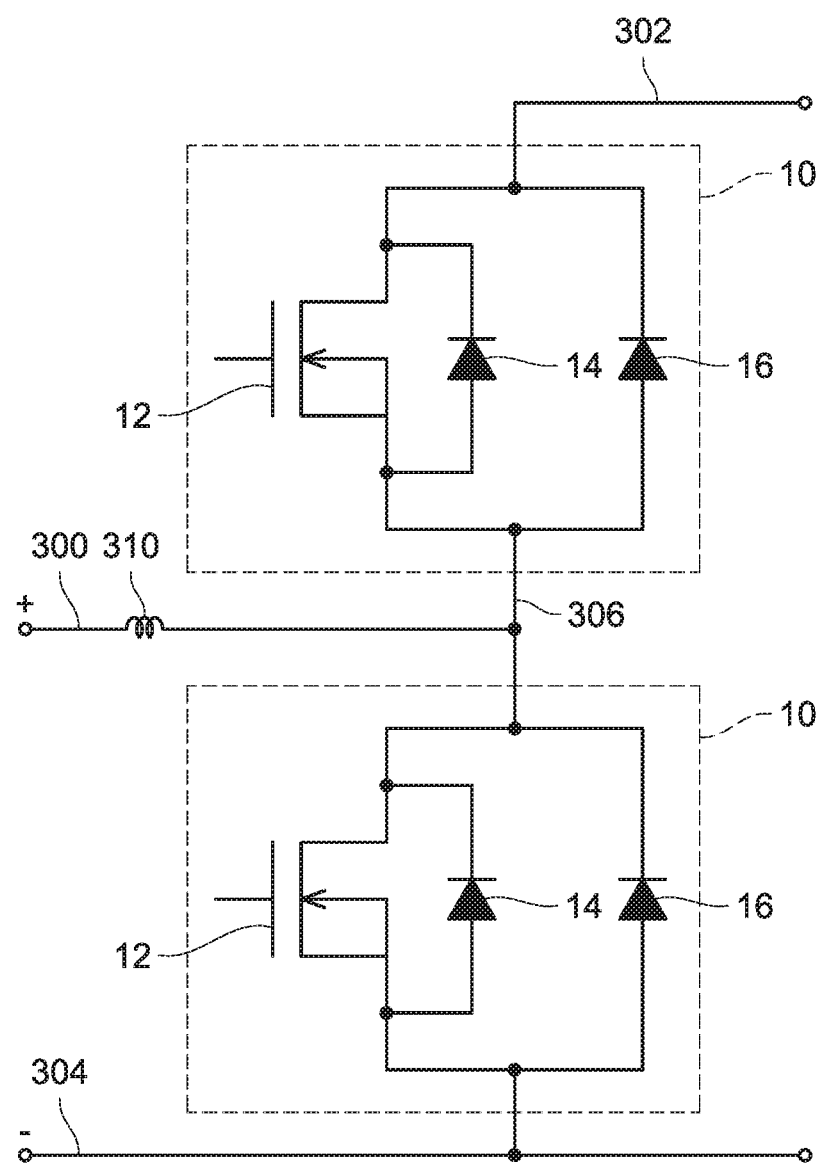
FIG. 14 is a circuit diagram of a DC-DC converter circuit that includes the semiconductor modules according to the embodiment.

Although the above-described embodiment has described the semiconductor module used in the inverter circuit the technique disclosed herein may be applied to a semiconductor module used in a DC-DC converter circuit. FIG. 14 illustrates an example in which the semiconductor modules 10 are used in a DC-DC converter circuit. The DC-DC converter circuit in FIG. 14 includes a high-potential input wire 300, a high-potential output wire 302, a low-potential wire 304, and a connecting wire 306. A direct-current voltage is applied between the high-potential input wire 300 and the low-potential wire 304 by a power source (not illustrated). A reactor 310 is connected between the high-potential input wire 300 and the connecting wire 306. One semiconductor module 10 is connected between the high-potential output wire 302 and the connecting wire 306. One semiconductor module 10 is connected between the connecting wire 306 and the low-potential wire 304. By the MOSFETs 12 of the semiconductor modules 10 switching, a potential that has been boosted from a potential of the high-potential input wire 300 is outputted to the high-potential output wire 302. As described above, the semiconductor module 10 may be used in a DC-DC converter circuit. In this case as well, an inrush current can be suppressed from flowing through the body diode 14.

Correspondences between the constituent elements of the above-described embodiment and constituent elements recited in the claims will be described below. The semiconductor substrate 32a of the embodiment is an example of a first semiconductor substrate in the claims. The semiconductor substrate 30a of the embodiment is an example of a second semiconductor substrate in the claims. The current path 112 of the embodiment is an example of a first current path in the claims. The current path 110 of the embodiment is an example, of a second current path in the claims. The semiconductor substrate 35a of the embodiment is an example of a third semiconductor substrate in the claims.

Some of technical elements disclosed herein will be listed below. It should be noted that the respective technical elements are independent of one another, and are useful solely or in combinations.

In an example of semiconductor module disclosed herein, the second semiconductor substrate may further comprise an insulated gate bipolar transistor. A collector of the insulated gate bipolar transistor may be connected to the cathode electrode. An emitter of the insulated gate bipolar transistor may be connected to the anode electrode.

In another example of semiconductor module disclosed herein, the semiconductor module may further comprise a third semiconductor chip comprising: a third semiconductor substrate comprising an insulated gate bipolar transistor, a collector electrode provided on one surface of the third semiconductor substrate; and an emitter electrode provided on a surface of the third semiconductor substrate other than the one surface of the third semiconductor substrate. The first lead frame may be connected to the collector electrode. The second lead frame may be connected to the emitter electrode. The third semiconductor chip may be located between the first semiconductor chip and the second semiconductor chip.

As described above, the third semiconductor chip comprising the insulated gate bipolar transistor may be provided, separately from the first and second semiconductor chips. In this configuration, the third semiconductor chip is arranged between the first and second semiconductor chips, thus a difference between the length of the first current path and the length of the second current path can be made larger. Thus, a parasitic inductance of the first current path can be made much larger than a parasitic inductance of the second current path relatively. Accordingly, an inrush current that flows through a body diode of a field effect transistor can be further reduced.

While specific examples of the present disclosure have been described above in detail, these examples are merely illustrative and place no limitation on the scope of the patent claims. The technology described in the patent claims also encompasses various changes and modifications to the specific examples described above. The technical elements explained in the present description or drawings provide technical utility either independently or through various combinations. The present disclosure is not limited to the combinations described at the lime the claims are filed. Further, the purpose of the examples illustrated by the present description or drawings is to satisfy multiple objectives simultaneously, and satisfying any one of those objectives gives technical utility to the present disclosure.

What is claimed is:

1. A semiconductor module, comprising:
   a first semiconductor chip comprising:
      a first semiconductor substrate comprising a field effect transistor and constituted of SiC (silicon carbide);
      a drain electrode provided on one surface of the first semiconductor substrate; and
      a source electrode provided on a surface of the first semiconductor substrate other than the one surface of the first semiconductor substrate;
   a second semiconductor chip comprising:
      a second semiconductor substrate comprising a diode;
      a cathode electrode provided on one surface of the second semiconductor substrate; and
      an anode electrode provided on a surface of the second semiconductor substrate other than the one surface of the second semiconductor substrate;
   a first lead frame comprising a first main terminal and connected to the drain electrode and the cathode electrode; and
   a second lead frame comprising a second main terminal and connected to the source electrode and the anode electrode,
   wherein
   a first current path extending from the second main terminal to the first main terminal through the first semiconductor chip is longer than a second current path extending from the second main terminal to the first main terminal through the second semiconductor chip.

2. The semiconductor module of claim 1, wherein
   the second semiconductor substrate further comprises an insulated gate bipolar transistor,
   a collector of the insulated gate bipolar transistor is connected to the cathode electrode, and
   an emitter of the insulated gate bipolar transistor is connected to the anode electrode.

3. The semiconductor module of claim 1, further comprising:
   a third semiconductor chip comprising:
      a third semiconductor substrate comprising an insulated gate bipolar transistor;
      a collector electrode provided on one surface of the third semiconductor substrate; and
      an emitter electrode provided on a surface of the third semiconductor substrate other than the one surface of the third semiconductor substrate,
   wherein
   the first lead frame is connected to the collector electrode,
   the second lead frame is connected to the emitter electrode, and
   the third semiconductor chip is located between the first semiconductor chip and the second semiconductor chip.

* * * * *